US006885021B2

(12) United States Patent
Apodaca et al.

(10) Patent No.: US 6,885,021 B2
(45) Date of Patent: Apr. 26, 2005

(54) ADHESION LAYER FOR A POLYMER MEMORY DEVICE AND METHOD THEREFOR

(75) Inventors: Mac Apodaca, San Jose, CA (US); Jon-Won S. Lee, Sunnyvale, CA (US); Kuo-Wei Chang, Sunnyvale, CA (US)

(73) Assignee: Ovonyx, Inc., Boise, ID (US)

(*) Notice: Subject to any disclaimer, the term of this patent is extended or adjusted under 35 U.S.C. 154(b) by 11 days.

(21) Appl. No.: 10/036,833

(22) Filed: Dec. 31, 2001

(65) Prior Publication Data

US 2003/0122170 A1 Jul. 3, 2003

(51) Int. Cl.[7] .................. H01L 47/00; H01L 21/00; H01L 21/20
(52) U.S. Cl. .................. 257/4; 257/200; 257/246; 438/93; 438/95; 438/398; 438/602
(58) Field of Search .................. 438/93–95, 398, 438/602; 257/3, 4, 200, 246

(56) References Cited

U.S. PATENT DOCUMENTS

| 5,897,352 A | * | 4/1999 | Lin et al. ............... 438/255 |
| 6,545,287 B1 | * | 4/2003 | Chiang .................. 257/3 |
| 2003/0001242 A1 | * | 1/2003 | Lowrey et al. ........... 257/646 |
| 2003/0052351 A1 | * | 3/2003 | Xu et al. ................ 257/296 |
| 2003/0073295 A1 | * | 4/2003 | Xu .................... 438/518 |

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS–Compatible Phase–Change Nonvolatile RAM Using NMOS Cell Transistors," presented at 2003 19th IEEE Non–Volatile Semiconductor Memory Workshop, Monterey, California, Feb. 26–20, 2003.

Ha, Y.H., Yi, Horii, H., Park, J.H., Joo, S.H., Park, S.O., Chung, U–In and Moon, J.T., "An Edge Contact Type Cell for Phase Change RAM Featuring Very Low Power Consumption," presented at IEEE 2003 Symposium on VLSI Technology, Kyoto, Japan, Jun. 12–14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase–change RAM Based on 0.24 mm–CMOS Technologies," presented at IEEE 2003 Symposium on VLSI Technology, Kyoto, Japan, Jun. 12–14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U–In and Moon, J.T., "A Novel Cell Technology Using N–doped GeSbTe Films for Phase Change RAM," presented at IEEE 2003 Symposium on VLSI Technology, Kyoto, Japan, Jun. 12–14, 2003.

* cited by examiner

*Primary Examiner*—Hsien-Ming Lee
(74) *Attorney, Agent, or Firm*—Trop, Pruner & Hu, P.C.

(57) ABSTRACT

Briefly, in accordance with one embodiment of the invention, a device, such as a memory cell, includes a dielectric layer and a layer of phase-change material with an adhesion layer between the dielectric layer and the layer of phase-change material.

27 Claims, 2 Drawing Sheets

ADHESION LAYER FOR A POLYMER MEMORY DEVICE AND METHOD THEREFOR

BACKGROUND

Phase change memory devices use phase change materials, i.e., materials that can be electrically switched between a generally amorphous and a generally crystalline state, for electronic memory application. One type of memory element utilizes a phase change material that can be, in one application, electrically switched between a structural state of generally amorphous and generally crystalline local order or between different detectable states of local order across the entire spectrum between completely amorphous and completely crystalline states.

Typical materials suitable for such application include those utilizing various chalcogenide elements. These electrical memory devices typically do not use field effect transistor devices, but comprise, in the electrical context, a monolithic body of thin film chalcogenide material. The state change materials are also truly non-volatile in that, when set in either a crystalline, semi-crystalline, amorphous, or semi-amorphous state representing a resistance value, that value is retained until reset as that value represents a physical state of the material (e.g., crystalline or amorphous).

A phase-change memory device may comprise an opening in a dielectric material that is filled with a phase-change material such as a chalcogenide material. However, typical dielectric materials and chalcogenide materials do not chemically bond well together. As a result, the layer of phase-change material may peel during subsequent manufacturing of the phase-change device, which in turn, may affect the yield or reliability of the device.

Thus, there is a continuing need for better ways to manufacture phase-change memory devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
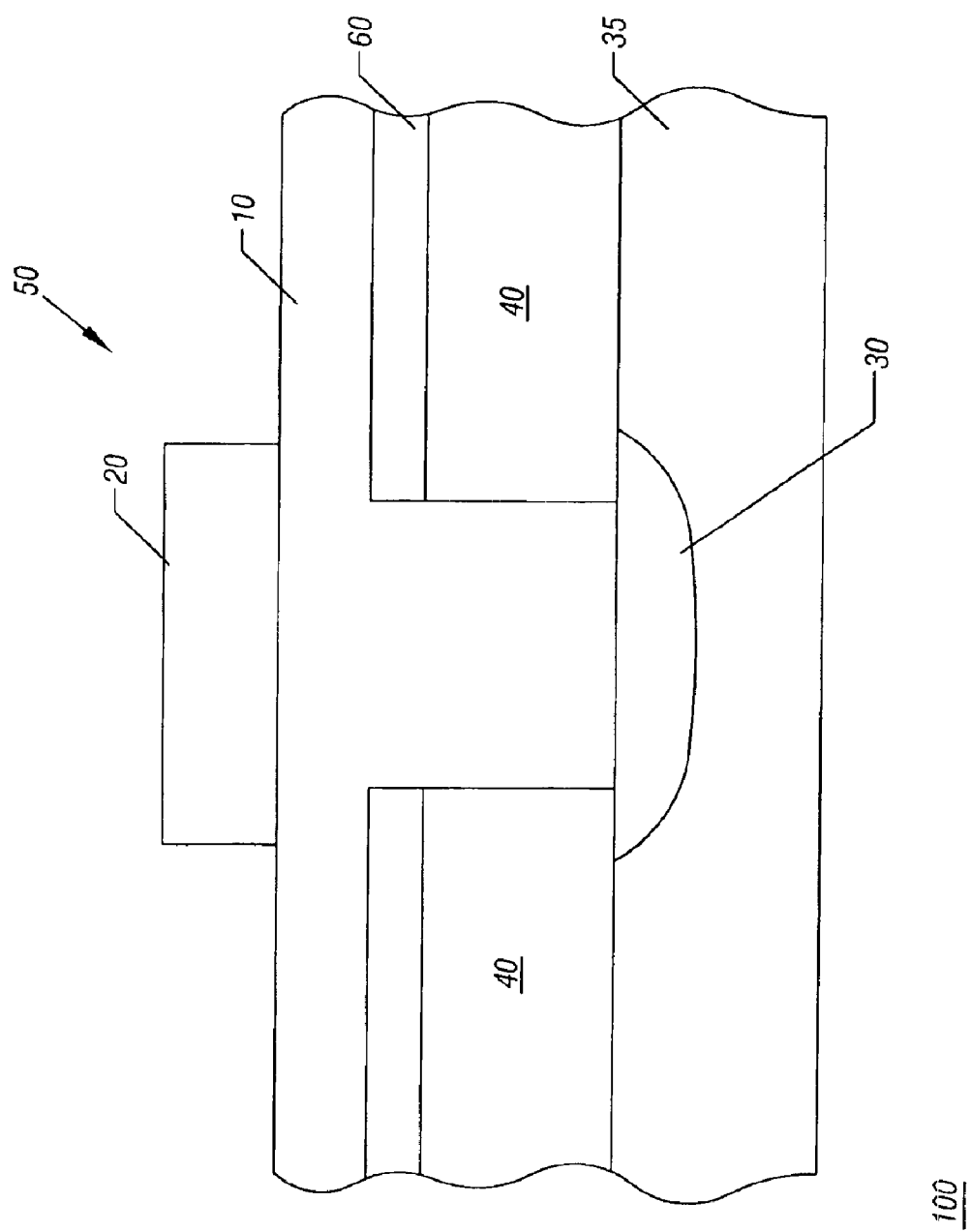
FIG. 1 is a cross section representation of a device in accordance with an embodiment of the present invention.

It will be appreciated that for simplicity and clarity of illustration, elements illustrated in the figures have not necessarily been drawn to scale. For examples the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Turning to FIG. 1, an embodiment 100 in accordance with the present invention is described. Embodiment 100 may comprise a memory cell 50 that may comprise phase-change material. Simply stated, memory cell 50 may include a layer of phase-change material 10 positioned between two electrodes. Although the scope of the present invention is not limited in this respect, one electrode may comprise a metal layer 20 while the other electrode is provided with a doped conductive region 30 formed in a semiconductor substrate 35.

However, it should be understood that the scope of the present invention is not limited by the particular arrangement or structure of memory cell 50. In alternative embodiments, memory cell 50 may be arranged differently and include additional layers and structures. For example, it may be desirable to form sidewall spacers, barrier metal layers, resistive elements, etc. It should be understood that the absence of these elements is not a limitation of the scope of the present invention. FIG. 1 has been simplified to illustrate how an adhesion or interfacial layer 60 may be used between a dielectric layer 40 and a layer of phase-change material 10. The other elements of memory cell 50 have been removed so as not to obscure the understanding of the invention.

The structure shown in FIG. 1 may be fashioned by forming dielectric layer 40 on the surface of a semiconductor substrate 35. Although the scope of the present invention is not limited in this respect, dielectric layer 40 may be formed from a variety of materials such as, for example, silicon dioxide, silicon nitride, or other material. Dielectric layer 40 may be used to provide electrical and/or thermal isolation for memory cell 50. The thickness and the technique used to formed dielectric layer 40 may be selected depending on the desired characteristics of memory cell 50. In this particular embodiment, dielectric layer 40 may be a layer of silicon dioxide that is about 10 Å–5000 Å that may be thermal grown on semiconductor substrate 35.

Thereafter, adhesion or interfacial layer 60 may be formed on dielectric layer 40. In this particular embodiment, interfacial layer 60 may be a layer of polycrystalline or amorphous silicon. For example, interfacial layer may be formed with a chemical vapor deposition (CVD) process involving silane, however, the scope of the present invention is not limited by the particular process used to form interfacial layer 60. Interfacial layer may have a thickness ranging from about 5 Å–5000 Å, although the scope of the present invention is not limited in this respect. It should also be understood that alternative processes may be used to form interfacial layer 60.

Although the scope of the present invention is not limited in this respect, interfacial layer 60 may be deposited at a reaction temperature ranging from about 480° C. to 650° C. As a result, interfacial layer 60 may be amorphous, polycrystalline, or any combination thereof. In this particular embodiment, interfacial layer 60 may consist essentially of silicon atoms. By using a CVD reaction, interfacial layer will include at least forty to nearly one-hundred percent of silicon atoms by weight. However, in alternative embodiments, interfacial layer 60 may include other elements or compounds. These elements may either be inert or be added to further enhance the chemical and/or electrical bonding between interfacial layer 60 and dielectric layer 40.

In yet other embodiments, additional layers may be formed between interfacial layer 60 and dielectric layer 40 to transition the materials or to further promote adhesion.

After the formation of interfacial layer 60, an opening may be formed through interfacial layer 60 and dielectric layer 40. For example, although the scope of the present invention is not limited in this respect, a photolithographic pattern and a reactive ion etch process may be used to expose a portion of semiconductor substrate 35. A doped region 30 may then be formed in semiconductor substrate 35 to serve as a lower electrode, although the scope of the present invention is not limited by the existence or technique used to formed doped region 30.

Thereafter, a layer of a phase-change material 10 may be formed overlying interfacial layer 60. Examples of phase change memory material include, but are not limited to, chalcogenide element(s) compositions of the class of tellerium-germanium-antimony ($Te_xGe_ySb_z$) material or GeSbTe alloys, although the scope of the present invention is not limited to just these. Alternatively, another phase-change material may be used whose electrical properties (e.g. resistance, capacitance, etc.) may be changed through the application of energy such as, for example, light, heat, or electrical current. In this particular embodiment, chalcogenide layer 10 may have a thickness ranging from about 300 to 600 Å.

The use of an adhesion or interfacial layer 60 between an underlying insulation layer (e.g. dielectric layer 40) and a layer of phase-change material (e.g. layer 10) may improve the adhesion characteristics of chalcogenide layer 10 to underlying structures. Interfacial layer 60 may have improved electrical and/or chemical bonding to dielectric layer 40 and chalcogenide layer 10 compared to forming a chalcogenide layer directly on a layer of dielectric material.

Again, it should be understood that the scope of the present invention is not limited to the structure shown in FIG. 1 or the manufacturing techniques described above. In alternative embodiments, additional layers or processing may be performed as part of the formation of memory cell 50. For example, additional etching (wet or dry) may be performed prior to the formation of interfacial layer 40 or chalcogenide layer 10. In addition, other layer(s) may be formed between dielectric layer 40 and interfacial layer 60, or between interfacial layer 60 and the layer of phase-change material.

Figure 2:
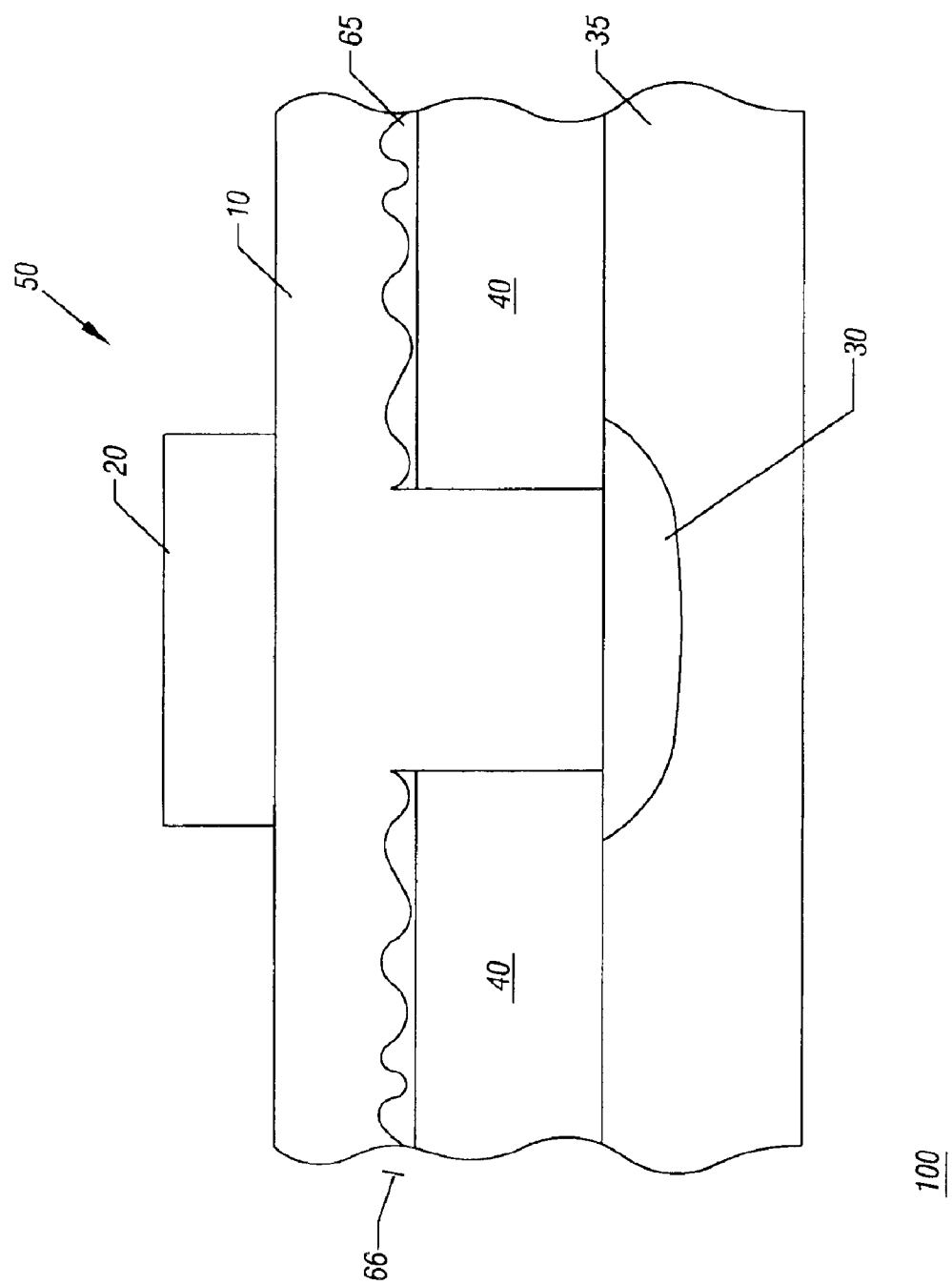
FIG. 2 is a cross section representation of a device in accordance with an alternative embodiment of the present invention.

Turning to FIG. 2, an alternative embodiment of the present invention is provided. To further increase the adhesion of chalcogenide layer 10 to underlying structures, it may be desirable to form an adhesion layer 65 with a material that results in a rough upper surface. For example, although the scope of the present invention is not limited in this respect, and adhesion layer using hemispheric grain (HSG) polysilicon, rough silicon, or rugged silicon may be used. Adhesion layer 65 may be formed so as to have three-dimensional grains that extend in both the plane of the film and that extend outward above the surface. Adhesion layer 65 may be formed so that its resulting surface comprised bumps having an average height of at least 30 Angstroms (Indicated in FIG. 2 with a bracket 66).

By having a rough surface, the overall surface area of adhesion layer 65 will be greater than the surface area than the underlying portion of dielectric layer 40. Described another way, if a the surface of dielectric layer 40 is allowed to define a plane, then a shape, such as a square, may be drawn arbitrarily drawn on the surface of dielectric layer. The shape may then define a surface area of the dielectric layer. With a roughened surface, the surface area of adhesion layer 65 corresponding to and over the shape will be greater to the grains that extend upward. The three-dimensional, rough surface of adhesion layer 65 may increase the overall electrical and/or chemical bonding of chalcogenide layer 40 to adhesion layer 65.

In this particular embodiment, adhesion layer 65 may be formed with hemispheric grain polysilicon. An HSG process may involve depositing amorphous silicon thin films on dielectric layer 40 using a low pressure chemical vapor deposition (LPCVD) furnace near one Torr with a temperature between about 510° C. and 600° C. in a silane atmosphere. Any native oxide is removed, for example using a hydrofluoric acid (HF) dip.

The hemispheric grains are then grown in an ultra-high vacuum chemical vapor deposition (UHVCVD) chamber while irradiating for 60 seconds. A gas such as disilane gas at 10 s.c.c.m. is introduced. The chamber is heated to 200° C.–300° C. and the flow of gas is terminated after about 60 seconds. The gas pressure may be maintained at $10^{-8}$ Torr. The chamber is heated to 600° C. with a total treatment time is at least 300 seconds. Although it should be understood that the scope of the present invention is not limited to this particular manufacturing process. In alternative embodiments, the deposition process may be altered so that the grains of adhesion layer 65 may range from about 10 Å to over 500 Å. Due to the three-dimensional nature of adhesion layer 65, the adhesion between adhesion layer 65 and the overlying layer of phase-change material may be improved.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus comprising:
   a dielectric layer;
   an adhesion layer comprising hemispheric grain polysilicon overlying the dielectric layer; and
   a phase-change material overlying the adhesion layer.

2. The apparatus of claim 1, wherein the adhesion layer is on the dielectric layer.

3. The apparatus of claim 1, wherein the phase-change material is on the adhesion layer.

4. The apparatus of claim 1, wherein the adhesion layer consists essentially of silicon.

5. The apparatus of claim 1, wherein the adhesion layer comprises at least forty percent silicon atoms by weight.

6. The apparatus of claim 1, wherein the adhesion layer comprises three dimensional grains.

7. An apparatus comprising:
   an adhesion layer comprising silicon having a rough surface; and
   a phase-change material on the adhesion layer.

8. The apparatus of claim 7, wherein the adhesion layer comprises hemispherical grain polysilicon.

9. The apparatus of claim 7, wherein the adhesion layer has a surface comprising bumps having an average height of at least 30 Angstroms.

10. The apparatus of claim 7, further comprising a dielectric layer, wherein the adhesion layer is on the dielectric layer.

11. The apparatus of claim 10, wherein the dielectric layer comprises silicon dioxide or silicon nitride.

12. The apparatus of claim 7, wherein the phase-change material comprises a chalcogenide alloys.

13. The apparatus of claim 12, wherein the phase-change material comprises GeSbTe alloys.

14. A method comprising:
   forming an interfacial layer having hemispheric grains; and forming a phase-change material over said interfacial layer.

15. The method of claim 14, wherein forming an interfacial layer includes forming an interfacial layer over an insulator.

16. The method of claim 14 wherein forming an interfacial layer includes forming a layer comprising silicon.

17. The method of claim 14 further including forming the interfacial layer over a layer of dielectric material.

18. The method of claim 17 further including forming an opening through said interfacial layer and said dielectric material.

19. The method of claim 18 further including forming the phase-change material over the interfacial layer and in the opening.

20. An apparatus comprising:
   an adhesion layer having bumps of at least 30 Angstroms; and
   a chalcogenide phase-change material on said adhesion layer.

21. The apparatus of claim 20 wherein said adhesion layer includes silicon.

22. The apparatus of claim 20 wherein said adhesion layer comprises hemispherical grain polysilicon.

23. The apparatus of claim 20 wherein said adhesion layer includes polysilicon.

24. An apparatus comprising:
   an adhesion layer having bumps of at least 25 Angstroms;
   a dielectric layer, said adhesion layer on the dielectric layer; and
   a phase-change material on the adhesion layer.

25. The apparatus of claim 24 wherein said adhesion layer includes silicon.

26. The apparatus of claim 24 wherein said adhesion layer comprises hemispherical grain polysilicon.

27. The apparatus of claim 24 wherein said adhesion layer includes polysilicon.

* * * * *

UNITED STATES PATENT AND TRADEMARK OFFICE
CERTIFICATE OF CORRECTION

PATENT NO. : 6,885,021 B2  
APPLICATION NO. : 10/036833  
DATED : April 26, 2005  
INVENTOR(S) : Mac Apodaca, Jong-Won S. Lee and Kuo-Wei Chang It is certified that error appears in the above-identified patent and that said Letters Patent is hereby corrected as shown below:

<u>Column 6</u>:
Line 11, "25 Angstroms" should be --30 Angstroms--.

Signed and Sealed this

Second Day of October, 2007

JON W. DUDAS  
*Director of the United States Patent and Trademark Office*